(12) United States Patent
Kajiyama et al.

(10) Patent No.: US 7,527,547 B2
(45) Date of Patent: May 5, 2009

(54) WAFER PROCESSING METHOD

(75) Inventors: Keiichi Kajiyama, Tokyo (JP); Tadato Nagasawa, Tokyo (JP)

(73) Assignee: Disco Corporation, Tokyo (JP)

( * ) Notice: Subject to any disclaimer, the term of this patent is extended or adjusted under 35 U.S.C. 154(b) by 2 days.

(21) Appl. No.: 11/797,741

(22) Filed: May 7, 2007

(65) Prior Publication Data

US 2007/0264912 A1 Nov. 15, 2007

(30) Foreign Application Priority Data

May 12, 2006 (JP) .............................. 2006-133546

(51) Int. Cl.
*B24B 1/00* (2006.01)
(52) U.S. Cl. .............................. 451/41; 451/54; 451/55; 451/63
(58) Field of Classification Search .................. 451/41, 451/54, 55, 63; 438/459, 462
See application file for complete search history.

(56) References Cited

U.S. PATENT DOCUMENTS 6,581,586 B2 * 6/2003 Sekiya ..................... 125/13.01
7,384,859 B2 * 6/2008 Watanabe ................... 438/462
2006/0244096 A1 11/2006 Sekiya
2006/0292826 A1 * 12/2006 Kajiyama et al. ........... 438/459
2007/0134890 A1 * 6/2007 Watanabe ................... 438/462

FOREIGN PATENT DOCUMENTS

JP 7-106284 4/1995
JP 7-19461 1/2007

* cited by examiner

*Primary Examiner*—Timothy V Eley
(74) *Attorney, Agent, or Firm*—Smith, Gambrell & Russell, LLP (57) ABSTRACT

A method of processing a wafer having a device area in which a plurality of devise are formed and a peripheral excess area surrounding the device area on the front surface, comprising an annular groove forming step for forming an annular groove having a predetermined depth and a predetermined width at the boundary between the device area and the peripheral excess area in the rear surface of the wafer by positioning a cutting blade at the boundary; and a reinforcement forming step for grinding an area corresponding to the device area on the rear surface of the wafer in which the annular groove has been formed, to reduce the thickness of the device area to a predetermined thickness and allowing an area corresponding to the peripheral excess area on the rear surface of the wafer to be left behind to form an annular reinforcement.

2 Claims, 6 Drawing Sheets

WAFER PROCESSING METHOD

FIELD OF THE INVENTION

The present invention relates to a method of processing the rear surface of a wafer having a plurality of devices formed on the front surface.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a device such as IC or LSI is formed in each of the sectioned areas. Individual semiconductor chips are manufactured by cutting this semiconductor wafer along the streets to divide it into the areas having each a device formed therein. An optical device wafer having a gallium nitride-based compound semiconductor laminated on the surface of a sapphire substrate is also cut along streets to be divided into individual optical devices such as light-emitting diodes or laser diodes, which are widely used in electric appliances.

Cutting along the streets of the above semiconductor wafer or optical device wafer is generally carried but by using a cutting machine called "dicer". This cutting machine comprises a chuck table for holding a workpiece such as a semiconductor wafer, a cutting means comprising a cutting blade for cutting the workpiece held on the chuck table, and a moving (processing-feed) means for moving the chuck table and the cutting means relative to each other, as disclosed by JP-A 7-106284. The cutting means has a spindle unit comprising a rotary spindle, a cutting blade mounted on the spindle and a drive mechanism for rotary-driving the rotary spindle.

The rear surface of the wafer to be divided as described above is ground or etched to achieve a predetermined thickness before it is cut along the streets. To reduce the weights and sizes of electric appliances, the thickness of the wafer must be reduced to 50 µm or less.

However, when the thickness of the wafer is reduced to 50 µm or less, such a problem arises that the wafer is easily broken and it is difficult to handle it in its conveyance, etc.

To solve the above problem, JP-A 2007-19461 related to the assignee of the present application has disclosed a wafer processing method in which the thickness of a device area on the rear surface of a wafer is reduced to a predetermined thickness by grinding an area corresponding to the device area, leaving a peripheral excess area on the rear surface of the wafer behind as an annular reinforcement, in order to make it easy to handle the thinned-out wafer in conveyance, etc.

To reduce the thickness of the device area to a predetermined thickness by grinding the area corresponding to the device area on the rear surface of the wafer and leaving the peripheral excess area on the rear surface of the wafer behind to form an annular reinforcement, the wafer is held on the chuck table of the grinding machine and ground with a grinding wheel having such a diameter that it passes over the center of rotation of the wafer and does not reach the peripheral excess area. Therefore, to grind the wafer with a grinding wheel for rough-grinding and then with a grinding wheel for finishing, extremely high positioning accuracy for positioning the grinding wheel at the boundary between the device area and the peripheral excess area is required and hence, finish-grinding may not be carried out on the inner peripheral surface of the reinforcement that has been formed annular by rough-grinding. When this inner peripheral surface of the annular reinforcement is not finish-ground and left roughly ground, there is a problem that the wafer is easily broken.

Further, when the area corresponding to the device area on the rear surface of the wafer is ground to reduce the thickness of the device area to a predetermined thickness and the peripheral excess area of the rear surface of the wafer is left behind as the annular reinforcement, a circular arc portion is formed at the boundary between the device area and the peripheral excess area due to a circular arc portion formed at the outer periphery corner of the grinding surface of the grinding stone. Therefore, there arises a problem that the thickness of a device adjacent to the peripheral excess area increases toward the peripheral excess area.

SUMMARY OF THE INVENTION

It is an object of the present invention to provide a wafer processing method which is capable of making an area corresponding to the device area on the rear surface uniform in thickness and does not reduce the strength of an annular reinforcement left behind in the peripheral excess area on the rear surface of the wafer.

To attain the above object, according to the present invention, there is provided a method of processing a wafer having a device area in which a plurality of devices are formed and a peripheral excess area surrounding the device area, on the front surface, comprising:

an annular groove forming step for forming an annular groove having a predetermined depth and a predetermined width at the boundary between the device area and the peripheral excess area in the rear surface of the wafer by positioning a cutting blade at the boundary; and a reinforcement forming step for grinding an area corresponding to the device area on the rear surface of the wafer in which the annular groove has been formed, to reduce the thickness of the device area to a predetermined thickness and allowing an area corresponding to the peripheral excess area on the rear surface of the wafer to be left behind to form an annular reinforcement.

The width of the annular groove formed in the above annular groove forming step is preferably 0.5 mm or more.

According to the present invention, since the annular groove having a predetermined depth and a predetermined width is formed at the boundary between the device area and the peripheral excess area in the rear surface of the wafer by positioning the cutting blade at the boundary, the grinding wheel does not need to be positioned on the inner peripheral surface of the annular reinforcement at high accuracy. Further, since the inner peripheral surface of the annular reinforcement formed in the peripheral excess area is cut with the cutting blade, it is a smooth cut surface equivalent or superior to a surface obtained by grinding with the grinding wheel for finish-grinding, whereby strength does not drop unlike a roughly ground semiconductor. Although a circular arc portion is formed at the outer periphery corner of the grinding wheel, as it is positioned within the width of the annular groove, the thickness of a device adjacent to the peripheral excess area does not increase toward the peripheral excess area. Therefore, the area corresponding to the device area on the rear surface of the wafer can be made uniform in thickness.

DETAILED DESCRIPTION OF THE PREFERRED EMBODIMENTS

A preferred embodiment of the present invention will be described in detail hereinunder with reference to the accompanying drawings.

Figure 1:
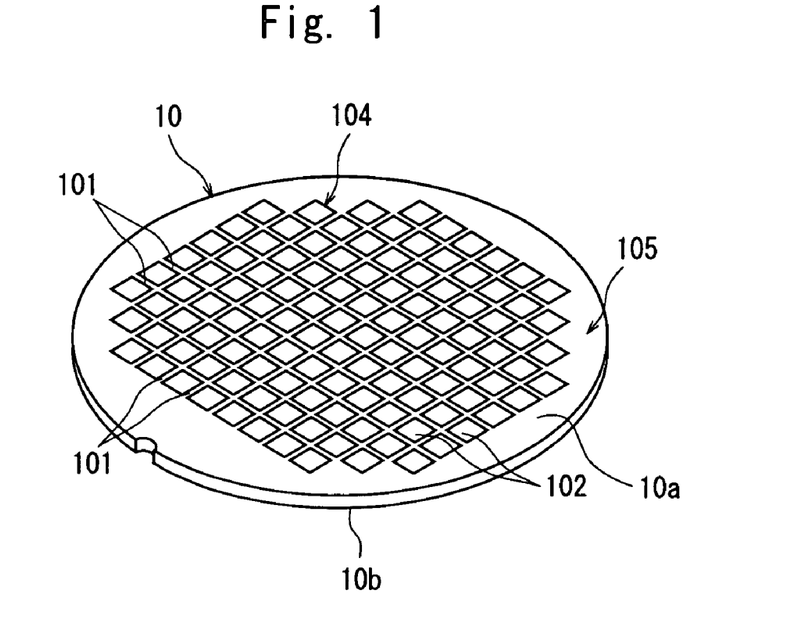
FIG. 1 is a perspective view of a semiconductor wafer to be processed by the wafer processing method of the present invention.

FIG. 1 is a perspective view of a semiconductor wafer as a wafer to be processed by the wafer processing method of the present invention. The semiconductor wafer 10 shown in FIG. 1 is, for example, a silicon wafer having a thickness of 700 μm, and it has a plurality of streets 101 formed in a lattice pattern on the front surface 10a, and a device 102 such as IC or LSI is formed in a plurality of areas sectioned by the plurality of streets 101. The semiconductor wafer 10 constituted as described above has a device area 104 where the devices 102 are formed and a peripheral excess area 105 surrounding the device area 104. The width of the peripheral excess area is set to 2 to 3 mm.

Figure 2:
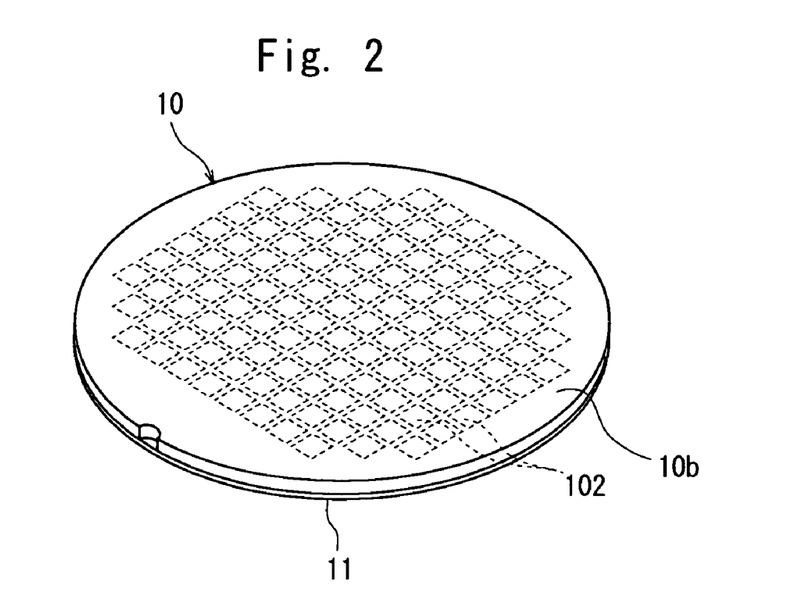
FIG. 2 is a perspective view showing a state where a protective member is affixed to the front surface of the semiconductor wafer shown in FIG. 1.

A protective member 11 is affixed to the front surface 10a of the thus constituted semiconductor wafer 10 as shown in FIG. 2 (protective member affixing step). Therefore, the rear surface 10b of the semiconductor wafer 10 is exposed.

The protective member affixing step is followed by the step of forming an annular groove having a predetermined depth and a predetermined width by positioning a cutting blade at the boundary between the device area 104 and the peripheral excess area 105 in the rear surface 10b of the semiconductor wafer 10. This annular groove forming step is carried out by using a cutting machine 2 shown in FIG. 3. The cutting machine 2 shown in FIG. 3 comprises a chuck table 21 having a suction-holding means, a cutting means 22 having a cutting blade 221 and an image pick-up means 23 for picking up an image of the workpiece held on the chuck table 21. The chuck table 21 is moved in a cutting-feed direction indicated by an arrow X in FIG. 3 by a cutting-feed mechanism that is not shown. The chuck table 21 is turned by a turning mechanism that is not shown. The cutting means 22 is moved in an indexing-feed direction indicated by an arrow Y by an indexing-feed mechanism. The cutting blade 221 of the cutting means 22 is, for example, a resin bond abrasive blade manufactured by bonding diamond abrasive grains with a resin bond or a metal bond abrasive blade manufactured by bonding diamond abrasive grains with a metal bond. The thickness of the cutting blade 221 is preferably 0.5 mm or more. The above image pick-up means 23 is in alignment with the cutting blade 221 in the cutting-feed direction indicated by the arrow X. This image pick-up means 23 comprises an infrared illuminating means for illuminating the workpiece with infrared radiation, an optical system for capturing the infrared radiation applied by the infrared illuminating means and an image pick-up device (infrared CCD) for outputting an electric signal corresponding to the infrared radiation captured by the optical system in addition to an ordinary image pick-up device (CCD) for picking up an image with visible radiation in the illustrated embodiment. An image signal is supplied to a control means that is not shown.

The annular groove forming step which is carried out by using the above cutting machine 2 will be described with reference to FIGS. 3 to 5.

Figure 3:
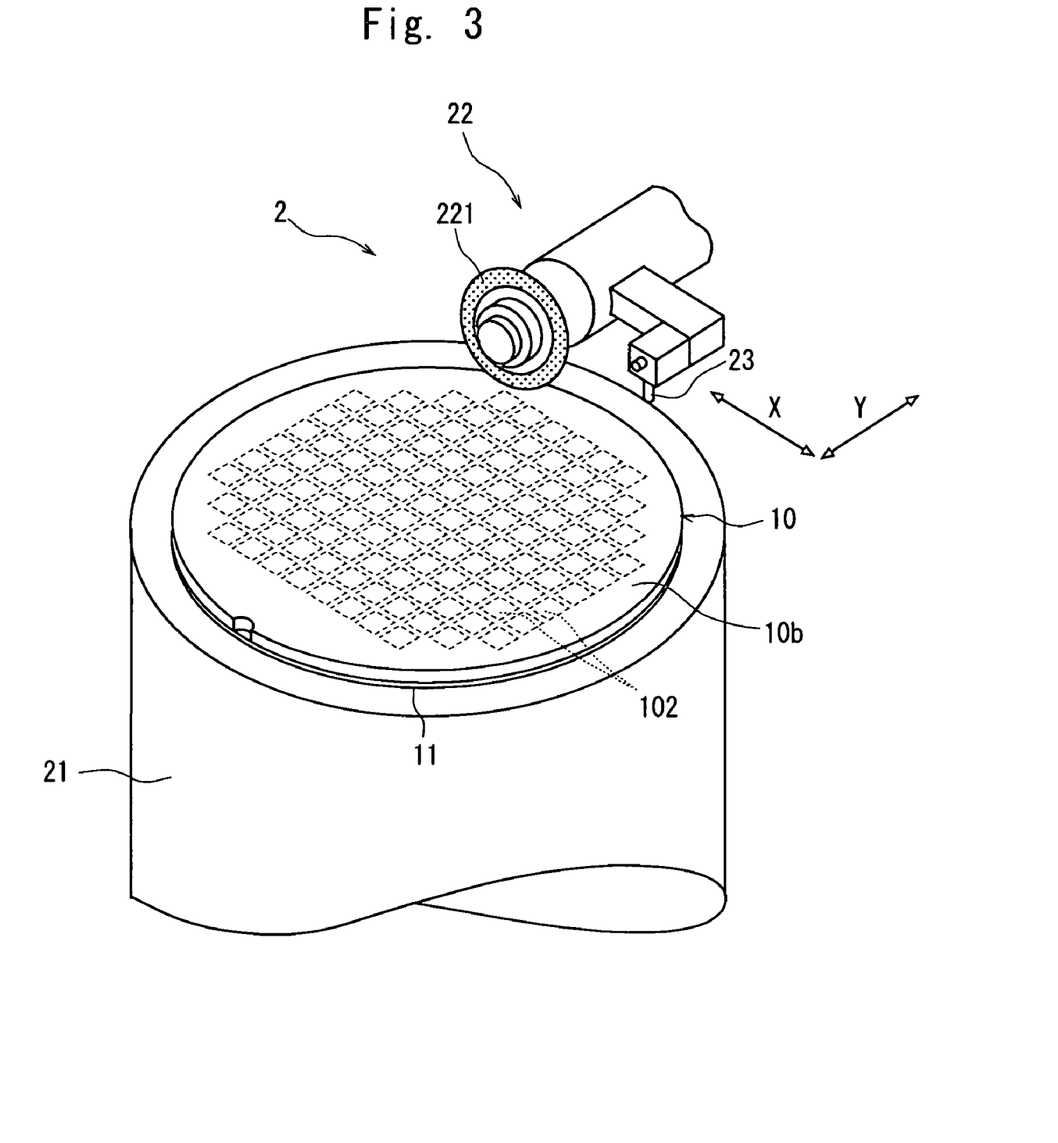
FIG. 3 is a perspective view of the principal section of a cutting machine for carrying out an annular groove forming step in the wafer processing method of the present invention.

That is, the protective member 11 side of the semiconductor wafer 10 to which the protective member 11 has been affixed in the above protective member affixing step is placed on the chuck table 21 of the cutting machine 2, as shown in FIG. 3. By activating a suction means (not shown), the semiconductor wafer 10 is held on the chuck table through the protective member 11. Therefore, the rear surface 10b of the semiconductor wafer 10 faces up. The chuck table 21 suction-holding the semiconductor wafer 10 through the protective member 11 is brought to a position right below the image pick-up means 23 by the cutting-feed mechanism that is not shown.

After the chuck table 21 is positioned right below the image pick-up means 23, an alignment step for detecting the area to be cut of the semiconductor wafer 10 is carried out by the image pick-up means 23 and the control means that is not shown. That is, the image pick-up means 23 and the control means (not shown) carry out alignment work for aligning the boundary between the device area 104 and the peripheral excess area 105 of the semiconductor wafer 10 with the cutting blade 221. Although the front surface 10a of the semiconductor wafer 10 faces down at this point, as the image pick-up means 23 is constituted by an infrared illuminating means, an optical system for capturing infrared radiation and an image pick-up device (infrared CCD) for outputting an electric signal corresponding to the infrared radiation and the like, as described above, it can pick up an image of the boundary between the device area 104 and the peripheral excess area 105 through the rear surface 10b.

After the alignment of the cutting area is carried out by detecting the boundary between the device area 104 and the peripheral excess area 105 formed on the semiconductor wafer 10 held on the chuck table 21, the chuck table 21 holding the semiconductor wafer 10 is moved to a cutting area. The cutting blade 221 of the cutting means 22 is brought to a position right above the boundary between the device area 104 and the peripheral excess area 105 of the semiconductor wafer 10 held on the chuck table 21. The cutting blade 221 is then moved down (cutting-in fed) from a stand-by position shown by a two-dotted chain line while it is rotated in a direction indicated by an arrow 221a as shown in FIG. 4 to bring it to a predetermined cutting-in feed position shown by a solid line. This cutting-in feed position is set, for example, to a position on the rear surface 10b (top surface) side 30 μm from the front surface 10a (undersurface) of the semiconductor wafer 10.

Figure 4:
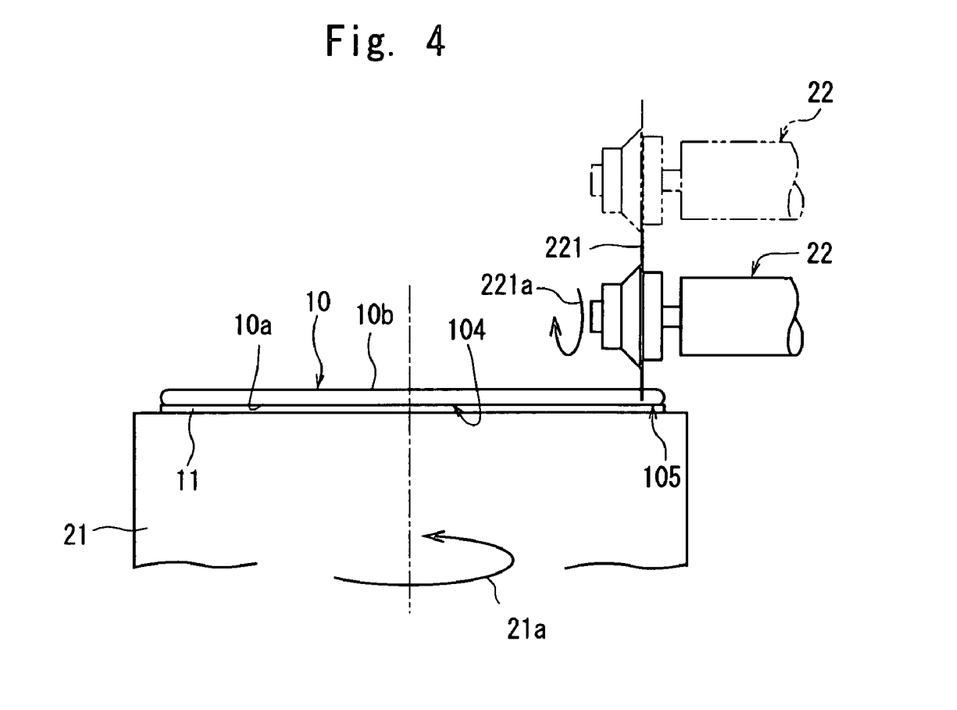
FIG. 4 is an explanatory diagram of the annular groove forming step in the wafer processing method of the present invention.
Figure 5:
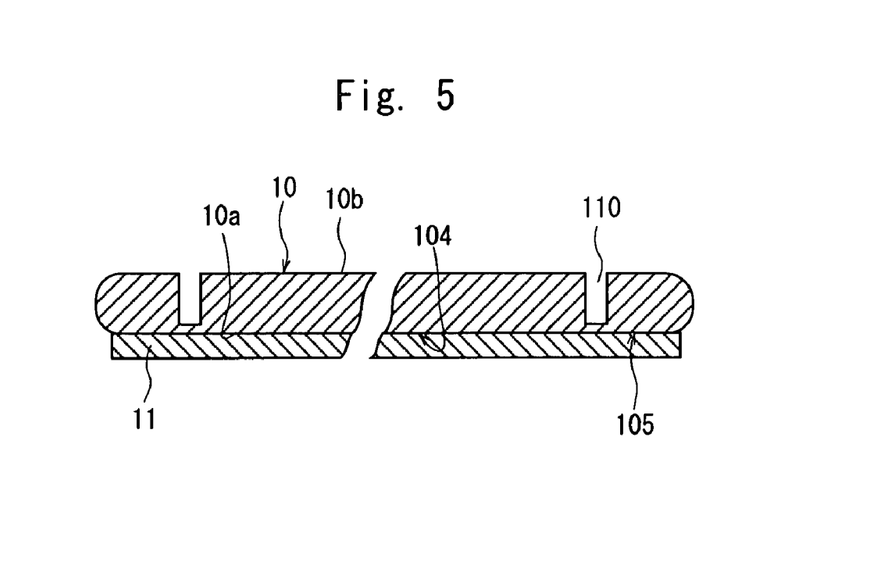
FIG. 5 is an enlarged sectional view of the semiconductor wafer which has been subjected to the annular groove forming step shown in FIG. 4.

Thereafter, the chuck table 21 is turned in a direction indicated by an arrow 21a in FIG. 4 while the cutting blade 221 is rotated in the direction indicated by the arrow 221a. An annular groove 110 having a predetermined depth and a predetermined width is formed at the boundary between the device area 104 and the peripheral excess area 105 in the rear surface 10b of the semiconductor wafer 10 by one turning of the chuck table 21, as shown in FIG. 5.

After the annular groove forming step, next comes the step of grinding an area corresponding to the device area 104 on the rear surface 10b of the semiconductor wafer 10 in which the annular groove 110 has been formed, to reduce the thickness of the device area 104 to a predetermined thickness and allowing an area corresponding to the excess area 105 on the rear surface 10b of the semiconductor wafer 10 to be left behind to form an annular reinforcement. This reinforcement forming step is carried out by using a grinding machine shown in FIG. 6. The grinding machine 3 shown in FIG. 6 comprises a substantially rectangular parallelepiped housing 4. A stationary support plate 41 is installed upright at the upper right end in FIG. 6 of the housing 4. The internal surface of this stationary support plate 41 is provided with two pairs of guide rails 42 and 42 and 43 and 43 extending in the vertical direction. A rough-grinding unit 5 as a rough-grinding means is mounted on one pair of guide rails 42 and 42 in such a manner that it can move in the vertical direction and a finish-grinding unit 6 as a finish-grinding means is mounted on the other pair of guide rails 43 and 43 in such a manner that it can move in the vertical direction.

Figure 6:
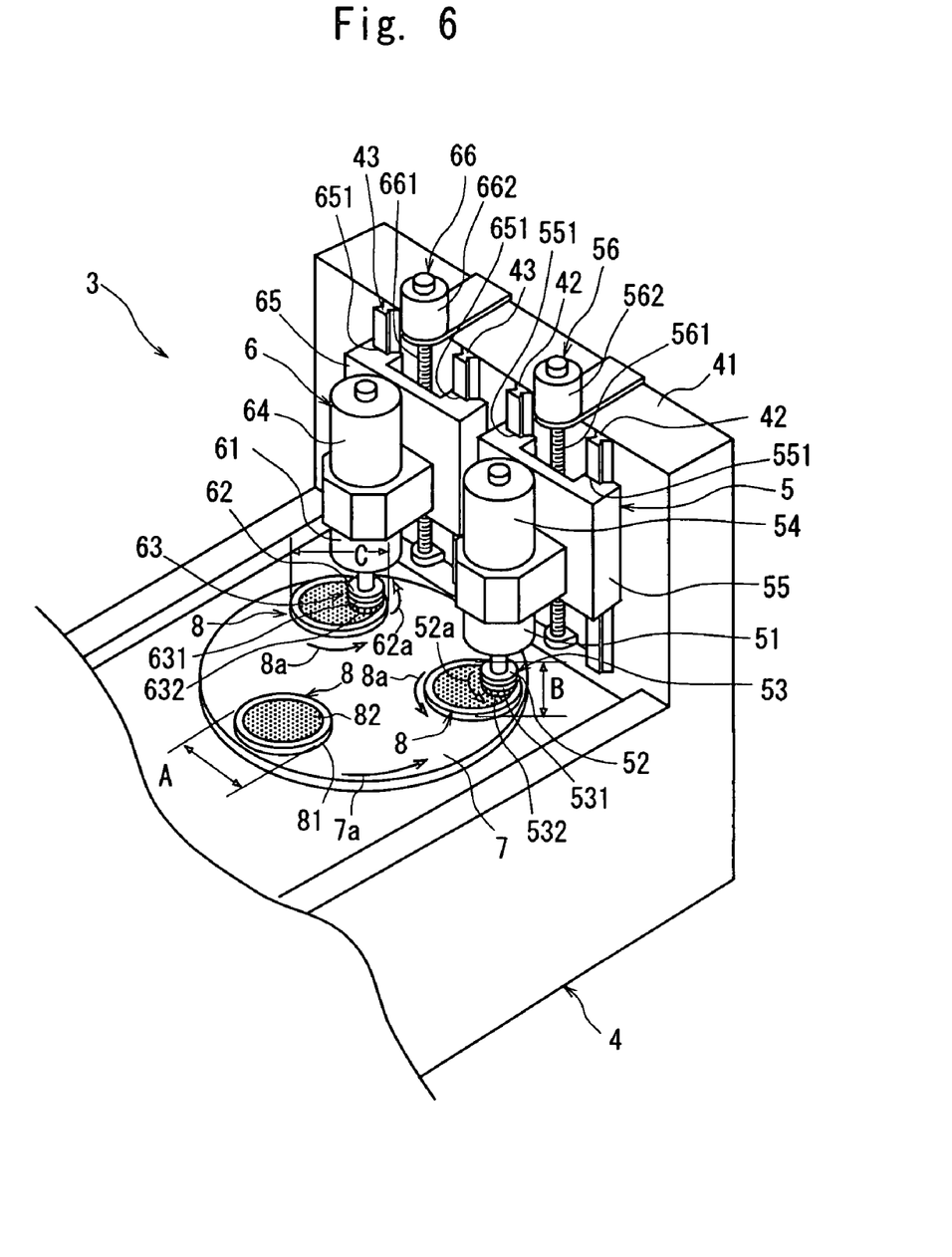
FIG. 6 is a perspective view of the principal section of a grinding machine for carrying out a reinforcement forming step in the wafer processing method of the present invention.

The rough-grinding unit 5 comprises a unit housing 51, a grinding tool 53 which is mounted on a tool mount 52 rotatably attached to the bottom of the unit housing 51, an electric motor 54 that is mounted on the top of the unit housing 51 and rotates the tool mount 52 in a direction indicated by an arrow 52a, and a movable base 55 mounting the unit housing 51. The grinding tool 53 is composed of an annular grinding base 531 and a grinding wheel 532 for rough-grinding, which is attached to the undersurface of the grinding base 531. The movable base 55 is provided with to-be-guided rails 551 and 551. By fitting the to-be-guided rails 551 and 551 to the guide rails 42 and 42 mounted on the above stationary support plate 41, respectively, the rough-grinding unit 5 is supported in such a manner that it can move in the vertical direction. The rough-grinding unit 5 in the illustrated embodiment has a grinding-feed mechanism 56 for moving the movable base 55 along the guide rails 42 and 42 to grinding-feed the grinding tool 53. The grinding-feed mechanism 56 comprises a male screw rod 561 which is arranged parallel to the guide rails 42 and 42 in the vertical direction and rotatably supported to the above stationary support plate 41, a pulse motor 562 for rotary-driving the male screw rod 561 and a female screw block (not shown) that is mounted on the above movable base 55 and is screwed to the male screw rod 561. By driving the male screw rod 561 in a normal direction or reverse direction with the pulse motor 562, the rough-grinding unit 5 is moved in the vertical direction (direction perpendicular to the holding surface of the chuck table which will be described later).

The above finish-grinding unit 6 is constituted the same as the rough-grinding unit 5 and comprises a unit housing 61, a grinding tool 63 which is mounted on a tool mount 52 rotatably attached to the bottom of the unit housing 61, an electric motor 64 that is mounted on the top of the unit housing 61 and rotates the tool mount 52 in a direction indicated by an arrow 62a, and a movable base 65 mounting the unit housing 61. The grinding tool 63 is composed of an annular grinding base 631 and a grinding wheel 632 for finish-grinding, which is attached to the undersurface of the grinding base 631.

The above movable base 65 is provided with to-be-guided rails 651 and 651. By fitting the to-be-guided rails 651 and 651 to the guide rails 43 and 43 on the above stationary support plate 41, respectively, the finish-grinding unit 6 is supported in such a manner that it can move in the vertical direction. The finish-grinding unit 6 in the illustrated embodiment comprises a grinding-feed mechanism 66 for moving the above movable base 65 along the guide rails 43 and 43 to grinding-feed the grinding tool 63. The grinding-feed mechanism 66 comprises a male screw rod 661 which is arranged parallel to the guide rails 43 and 43 in the vertical direction and rotatably supported to the above stationary support plate 41, a pulse motor 662 for rotary-driving the male screw rod 661 and a female screw block (not shown) that is mounted on the above movable base 65 and is screwed to the male screw rod 661. By driving the male screw rod 661 in a normal direction or reverse direction with the pulse motor 662, the finish-grinding unit 6 is moved in the vertical direction (direction perpendicular to the holding surface of the chuck table which will be described later).

The grinding machine in the illustrated embodiment comprises a turn table 7 which is substantially flush with the top surface of the housing 4 on the front side of the above stationary support plate 41. This turn table 7 is shaped like a disk having a relatively large diameter and properly turned in a direction indicated by an arrow 7a by a drive mechanism that is not shown. In the illustrated embodiment, three chuck tables 8 are installed on the turn table 7 at a phase angle of 120° in such a manner that they can turn on the horizontal plane. Each of the chuck tables 8 is composed of a disk-like base 81 and a disk-like adsorption holding chuck 82 made of a porous ceramic material, and the workpiece placed on the adsorption holding chuck 82 (holding surface) is suction-held by activating a suction means that is not shown. The chuck table 8 constituted as described above is turned in a direction indicated by an arrow 8a by a rotary-drive mechanism (not shown), as shown in FIG. 6. The three chuck tables 8 on the turn table 7 are moved to a workpiece take-in/take-out area A, a rough-grinding area B, a finish-grinding area C and the workpiece take-in/take-out area A sequentially by the proper rotation of the turn table 7.

Figure 7:
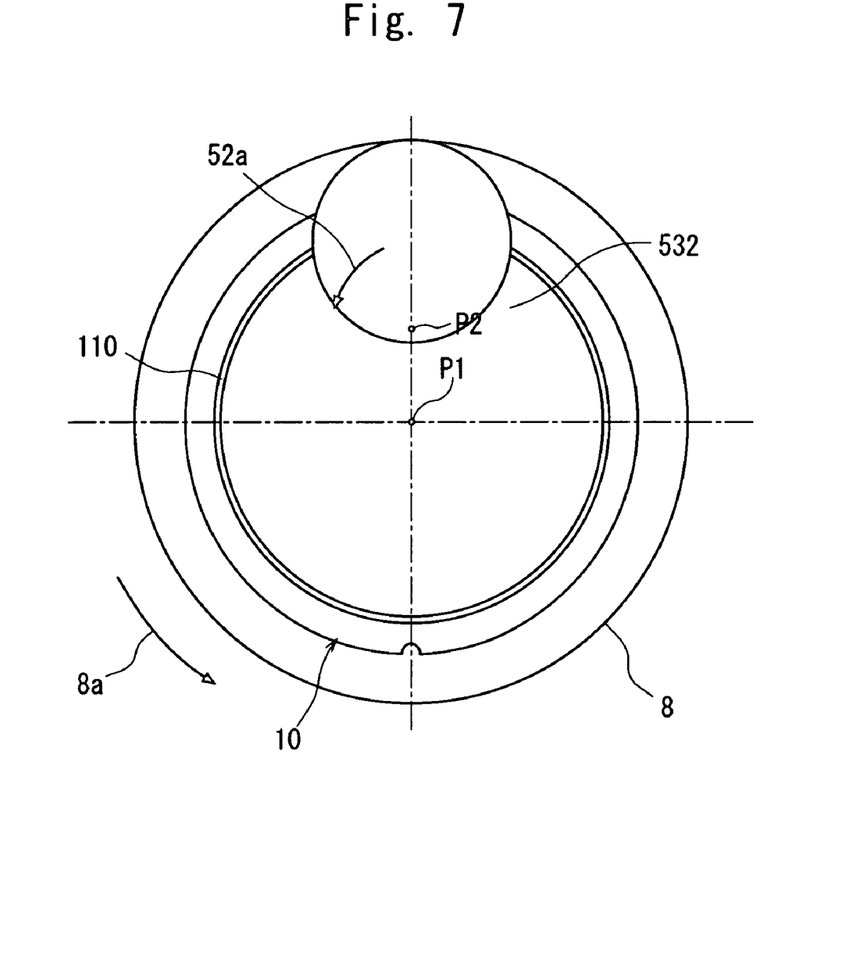
FIG. 7 is an explanatory diagram showing a rough-grinding step in the reinforcement forming step in the wafer processing method of the present invention.

To carry out the reinforcement forming step by using the above grinding machine 3, the protective member 11 side of the above semiconductor wafer 10 is placed on the top surface (holding surface) of a chuck table 8 positioned at the workpiece take-in/take-out area A by a conveyance means, and the semiconductor wafer 10 is suction-held on the chuck table 8. The turn table 7 is then turned at 120° in the direction indicated by the arrow 7a by the rotary-drive mechanism (not shown) to position the chuck table 8 mounting the semiconductor wafer 10 at the rough-grinding area B. The relationship between the semiconductor wafer 10 held on the chuck table 8 and the grinding wheel 532 for rough-grinding constituting the grinding tool 53 will be described hereinbelow with reference to FIG. 7. The center P1 of rotation of the chuck table 8 and the center P2 of rotation of the grinding wheel 532 are eccentric to each other, the diameter of the grinding wheel 532 is smaller than the diameter of the outer circumference of the annular groove 110 formed at the boundary between the device area 104 and the surplus area 105 of the semiconductor wafer 10 and larger than the radius of the inner circumference of the annular groove 110, and the annular grinding wheel 532 passes over the center P1 (the center of the semiconductor wafer 10) of rotation of the chuck table 8. Therefore, the grinding wheel 532 for rough-grinding may be positioned within the width of the annular groove 110 and does not need to be positioned at high accuracy.

Figure 8:
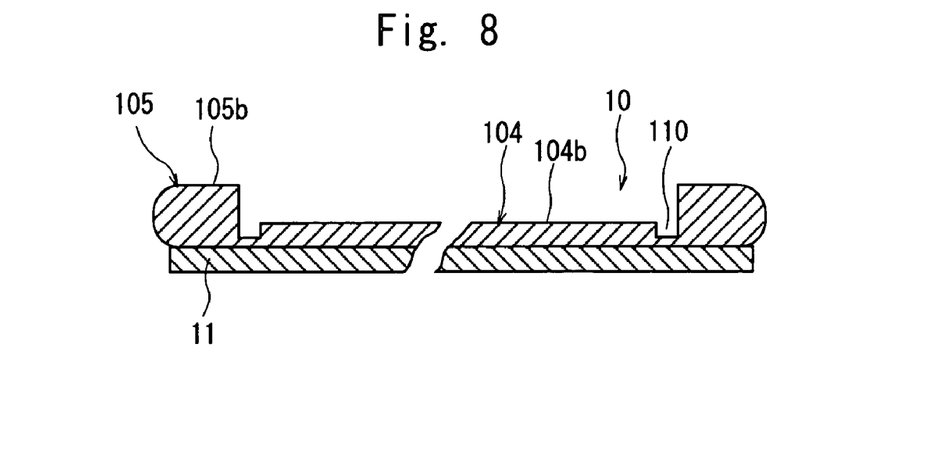
FIG. 8 is an enlarged sectional view of the semiconductor wafer which has been subjected to the rough-grinding step of the reinforcement forming step shown in FIG. 7.

Thereafter, while the chuck table 8 is rotated at 300 rpm in the direction indicated by the arrow 8a, the grinding wheel 532 is rotated at 6,000 rpm in the direction indicated by the arrow 52a, and at the same time, the grinding-feed mechanism 56 is activated to bring the grinding tool 53, that is, the grinding wheel 532 into contact with the rear surface 10b of the semiconductor wafer 10. The grinding tool 53, that is, the grinding wheel 532 is moved down a predetermined distance at a predetermined grinding-feed rate. As a result, an area corresponding to the device area 104 is roughly ground and removed to form a circular recess 104b having a thickness slightly larger than the predetermined thickness (for example, 30 μm) and at the same time, an area corresponding to the peripheral excess area 105 is left behind as an annular reinforcement 105b on the rear surface 10b of the semiconductor wafer 10, as shown in FIG. 8.

A semiconductor wafer 10 which has been subjected to the above annular groove forming step is placed on the next chuck table 8 positioned at the workpiece take-in/take-out area A during this. By activating the suction means that is not shown, the semiconductor wafer 10 is suction-held on the chuck table 8. The turn table 7 is then turned at 120° in the direction indicated by the arrow 7a to position the chuck table 8 holding the semiconductor wafer 2 which has been roughly ground, at the finish-grinding area C and the chuck table 8 holding the semiconductor wafer 8 before grinding at the rough-grinding area B.

The rear surface 10b of the semiconductor wafer 10 before rough-grinding held on the chuck table 8 positioned at the rough-grinding area B is roughly ground with the rough-grinding unit 5, and the rear surface 10b of the roughly ground semiconductor wafer 10 on the chuck table 8 positioned at the finish-grinding area C is finish-ground with the finish-grinding unit 6.

Finish-grinding processing will be described with reference to FIG. 9.

The outer diameter of the grinding wheel 632 for finish-grinding is made the same as that of the above grinding wheel 532 for rough-grinding. The grinding wheel 632 for finish-grinding is positioned such that it passes over the center P1 (center of the semiconductor wafer 10) of rotation of the chuck table 8, as shown in FIG. 9. At this point, the outer periphery of the grinding wheel 632 is located within the width of the annular groove 110 formed in the above annular groove forming step. Since the width of the annular groove 110 is set to 0.5 mm or more as described above in the illustrated embodiment, the grinding wheel 632 can be positioned within a predetermined range relatively easily without requiring extremely high accuracy.

Figure 9:
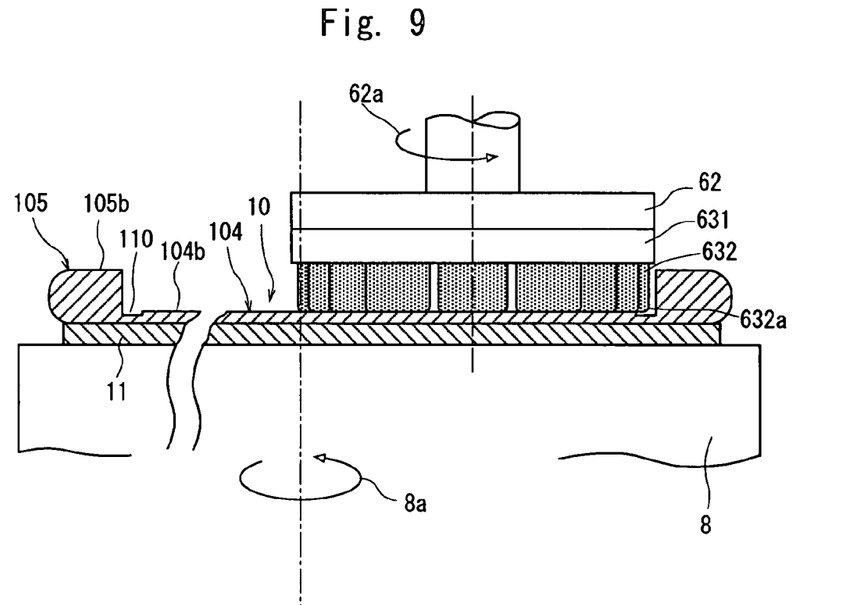
FIG. 9 is an explanatory diagram showing a finish-grinding step in the reinforcement forming step in the wafer processing method of the present invention.
Figure 10:
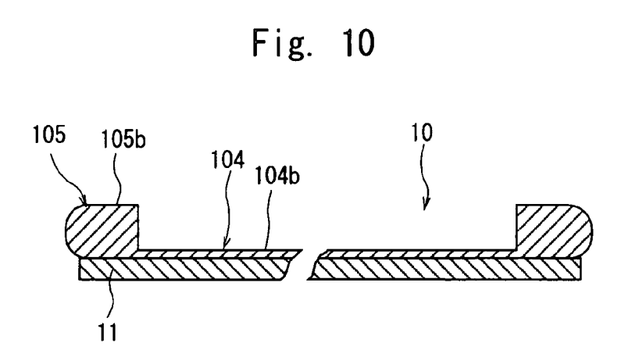
FIG. 10 is an enlarged sectional view of the semiconductor wafer which has been subjected to the finish-grinding step of the reinforcement forming step shown in FIG. 9.

Thereafter, as shown in FIG. 9, while the chuck table 8 is rotated at 300 rpm in the direction indicated by the arrow 8a, the grinding wheel 632 for finish-grinding is rotated at 6,000 rpm in the direction indicated by the arrow 62a, and at the same time, the grinding-feed mechanism 66 is activated to bring the grinding tool 63, that is, the grinding wheel 632 into contact with the bottom of the circular recess 104b formed in the rear surface 10b of the semiconductor wafer 10. The grinding tool 63, that is, the grinding wheel 632 is moved down by a predetermined distance at a predetermined grinding-feed rate. As a result, the bottom surface of the circular recess 104b formed in the rear surface 10b of the semiconductor wafer 10 is finish-ground and becomes flush with the bottom surface of the annular groove 110, as shown in FIG. 10. By grinding the bottom surface of the circular recess 104b formed in the rear surface 10b of the semiconductor wafer 10 by the grinding wheel 632 for finish-grinding, the bottom surface of the recess 104b becomes smooth and the strength of the semiconductor wafer 10 is improved. Although the inner peripheral surface of the annular reinforcement 105b is not ground with the grinding wheel 632 for finish-grinding, as the inner peripheral surface of the annular reinforcement 105b has been cut with the cutting blade 221 which is an abrasive blade as described above, it is formed as a smooth cut surface equivalent or superior to a surface ground with the grinding wheel 632 for finish-grinding, whereby strength does not drop unlike a roughly ground semiconductor. Further, although a circular arc portion 632a having a radius of 10 to 20 μm is formed at the periphery of the grinding wheel 632 as shown in FIG. 9, as it is positioned within the width of the annular groove 110, the thickness of a device adjacent to the peripheral excess area 105 does not increase toward the peripheral excess area 105. Therefore, the area corresponding to the device area 104 on the rear surface of the semiconductor wafer 10 can be made uniform in thickness.

What is claimed is:

1. A method of processing a wafer having a device area in which a plurality of devices are formed and a peripheral excess area surrounding the device area, comprising:
    an annular groove forming step for forming an annular groove having a predetermined depth and a predetermined width, in a rear surface of the wafer, at a boundary between the device area and the peripheral excess area by positioning a cutting blade at the boundary and turning a chuck table holding the wafer while the cutting blade is rotated; and
    a reinforcement forming step for grinding the device area of the rear surface of the wafer, in which the annular groove has been formed, to reduce the thickness of only the device area to a predetermined thickness and thereby allow the peripheral excess area of the rear surface of the wafer to be left behind so as to form an annular reinforcement.

2. The method of processing a wafer according to claim 1, wherein the width of the annular groove formed in the annular groove forming step is set to 0.5 mm or more.

* * * * *